(12) United States Patent
Matsumae et al.

(10) Patent No.: US 12,027,440 B2
(45) Date of Patent: Jul. 2, 2024

(54) COMPOSITE HAVING DIAMOND CRYSTAL BASE

(71) Applicant: NATIONAL INSTITUTE OF ADVANCED INDUSTRIAL SCIENCE AND TECHNOLOGY, Tokyo (JP)

(72) Inventors: Takashi Matsumae, Tsukuba (JP); Hitoshi Umezawa, Osaka (JP); Yuuichi Kurashima, Tsukuba-shi (JP); Hideki Takagi, Tsukuba (JP)

(73) Assignee: NATIONAL INSTITUTE OF ADVANCED INDUSTRIAL SCIENCE AND TECHNOLOGY (JP)

( * ) Notice: Subject to any disclaimer, the term of this patent is extended or adjusted under 35 U.S.C. 154(b) by 420 days.

(21) Appl. No.: 17/609,919

(22) PCT Filed: Apr. 17, 2020

(86) PCT No.: PCT/JP2020/016893
§ 371 (c)(1),
(2) Date: Nov. 9, 2021

(87) PCT Pub. No.: WO2020/230520
PCT Pub. Date: Nov. 19, 2020

(65) Prior Publication Data
US 2022/0230934 A1 Jul. 21, 2022

(30) Foreign Application Priority Data
May 10, 2019 (JP) .................................. 2019-089796

(51) Int. Cl.
*H01L 23/373* (2006.01)
*C30B 29/04* (2006.01)
(Continued)

(52) U.S. Cl.
CPC .......... *H01L 23/3732* (2013.01); *C30B 29/04* (2013.01); *C30B 29/06* (2013.01); *C30B 29/16* (2013.01); *C30B 33/06* (2013.01)

(58) Field of Classification Search
None
See application file for complete search history.

(56) References Cited

U.S. PATENT DOCUMENTS 5,212,401 A * 5/1993 Humphreys ............ H01L 29/47
438/105
5,463,271 A * 10/1995 Geis .......................... H01J 1/14
257/11

(Continued)

FOREIGN PATENT DOCUMENTS

JP H11-307747 A 11/1999
JP 3970399 B2 9/2007

(Continued)

OTHER PUBLICATIONS

Extended European Search Report dated Apr. 17, 2023 in corresponding European Patent Application No. 20805468.4.

(Continued)

*Primary Examiner* — Cory W Eskridge
(74) *Attorney, Agent, or Firm* — OSTROLENK FABER LLP (57) ABSTRACT

A composite that includes a base including an oxide layer MOx of an element M on a surface thereof and a diamond crystal base bonded to the surface of the base. The M is one or more selected from among metal elements capable of forming an oxide (excluding alkali metals and alkaline earth metals), Si, Ge, As, Se, Sb, Te, and Bi, and the diamond crystal base is bonded to the surface of the base by M-O—C bonding of at least some C atoms of the (111) surface of the diamond crystal base.

9 Claims, 7 Drawing Sheets

(51) Int. Cl.
*C30B 29/06* (2006.01)
*C30B 29/16* (2006.01)
*C30B 33/06* (2006.01)

(56) References Cited

U.S. PATENT DOCUMENTS

| | | | | |
|---|---|---|---|---|
| 6,159,604 | A | * 12/2000 | Adachi | ............... C01B 32/28 |
| | | | | 427/249.8 |
| 6,211,041 | B1 | 4/2001 | Ogura | ...................... 438/458 |
| 2007/0029935 | A1 | * 2/2007 | Sakai | ................. H01J 3/021 |
| | | | | 313/609 |
| 2016/0197027 | A1 | 7/2016 | Nasser-Faili | |
| 2020/0027683 | A1 | * 1/2020 | Taylor | ................ H01L 29/1602 |
| 2020/0354220 | A1 | * 11/2020 | Pedersen | .............. C01B 32/152 |

FOREIGN PATENT DOCUMENTS

| | | |
|---|---|---|
| JP | 2009-209028 A | 9/2009 |
| JP | 2010-222172 A | 10/2010 |
| JP | 2018-074172 A | 5/2018 |
| JP | 2019-021889 A | 2/2019 |
| JP | 2019-062020 A | 4/2019 |

OTHER PUBLICATIONS

International Search Report dated Jun. 23, 2020 in corresponding PCT International Application No. PCT/JP2020/016893.
Written Opinion dated Jun. 23, 2020 in corresponding PCT International Application No. PCT/JP2020/016893.
G.N. Yushin et al., Study of fusion bonding of diamond to silicon for silicon-on-diamond technology, Appl. Phys. Lett., 81(17), 3275-3277 (2002).
J. Haisma et al., Diversity and feasibility of direct bonding: a survey of a dedicated optical technology, Appl. Opt., 33(7), 1154-1169 (1994).

* cited by examiner

EXAMPLE 1

EXAMPLE 2

EXAMPLE 3

EXAMPLE 4

COMPARATIVE EXAMPLE

COMPOSITE HAVING DIAMOND CRYSTAL BASE

CROSS-REFERENCE TO RELATED APPLICATIONS

The present application is a 35 U.S.C. §§ 371 national phase conversion of PCT/JP2020/016893, filed Apr. 17, 2020, which claims priority to Japanese Patent Application No. 2019-089796, filed May 10, 2019, the contents of which are incorporated herein by reference. The PCT International Application was published in the Japanese language.

TECHNICAL FIELD

The present invention relates to a composite including a diamond crystal base bonded to a base in a state where the properties of diamond are utilized.

BACKGROUND ART

Diamond has extremely high thermal conductivity and dielectric breakdown electric field. By directly bonding an existing device to the diamond substrate, a significant improvement in cooling efficiency and input/output power can be expected. (Non Patent Literature 1) discloses a method of bonding C and Si on an atomic level by thermo-compression bonding a diamond substrate and a Si substrate at a temperature of 1000° C. or higher and a pressure of 32 MPa. However, a composite of the diamond and Si bonded by this method may break due to thermal expansion and thermal contraction.

Furthermore, a method in which an atomic level flat diamond substrate and a quartz glass are brought into contact with each other, heated to a temperature of 800° C. to 900° C. in a hydrogen atmosphere, and then the diamond and the quartz are bonded by a surface reaction of the contact surface is also known (Non Patent Literature 2). In this method, it is not necessary to apply a special bonding load. However, this method requires treatment under a hydrogen atmosphere and at a high temperature, and the emergence of a technique for bonding diamond to a substrate under mild conditions is desired.

CITATION LIST

Non Patent Literature

[Non Patent Literature 1]
G. N. Yushin et al., Appl. Phys. Lett., 81, 3275-3277 (2002).
[Non Patent Literature 2]
J. Haisma, B. A. C. M. Spierings, U. K. P. Biermann and A. A. van Gorkum, Appl. Opt., 33, 1154 (1994).

SUMMARY OF INVENTION

Technical Problem

An object of the present application is to provide a method for bonding a base and a diamond crystal base, in which the diamond can be bonded to the base in the atmosphere without the need for a special bonding load, not under high temperatures near 1000° C. and the diamond crystal structure is hardly altered in the vicinity of the bonding surface, and is to provide a composite including the diamond crystal base bonded to the base in which the diamond crystal structure is hardly altered in the vicinity of the bonding surface.

Solution to Problem

The composite of the present application includes a base having an oxide layer MOx of an element M on a surface thereof, and a diamond crystal base bonded to the surface of the base, wherein one or more selected from among metal elements capable of forming an oxide (excluding alkali metals and alkaline earth metals), Si, Ge, As, Se, Sb, Te, and Bi, and the diamond crystal base is bonded to the surface by M-O—C bonding of at least some C atoms of the (111) surface of the diamond crystal base.

An electronic device of an aspect of the present application includes the composite of the present application in which the diamond crystal base has a layered shape and one surface of the diamond crystal base is bonded to a surface of the base, and further includes an electronic element formed on the other surface of the diamond crystal base. An electronic device of another aspect of the present application includes the composite of the present application in which the base has a plate shape, one surface of the base is bonded to the (111) surface of the diamond crystal base, and further includes an electronic element formed on the other surface of the base material. In the method of hydroxylating the surface of the diamond crystal base of the present invention, the (111) surface of the diamond crystal base is treated with an oxidizing liquid, and OH groups are introduced to at least some C atoms on the (111) surface of the diamond crystal base.

The method for bonding a base and a diamond crystal base according to the present application includes a hydroxylation step of treating a (111) surface of the diamond crystal base with an oxidizing liquid to introduce OH groups to at least some C atoms of the (111) surface of the diamond crystal base, and a bonding step of bringing the (111) surface to which OH groups are introduced at the hydroxylation step into contact with the surface of the base having hydroxides of one or more selected from among metal elements capable of forming an oxide (excluding alkali metals and alkaline earth metals), Si, Ge, As, Se, Sb, Te, and Bi, and bonding the surfaces by applying dehydration energy to the contact portion to cause a dehydration reaction in the contact portion.

Advantageous Effects of Invention

According to the method for bonding a base and a diamond crystal base of the present invention, the diamond crystal base can be bonded to the base in the atmosphere at a low temperature of approximately 200° C. without the need for a special bonding load. In addition, in the composite including the diamond crystal base bonded to the base of the present application, the diamond crystal structure hardly changes in the vicinity of the bonded surface.

DESCRIPTION OF EMBODIMENTS

Figure 1A:
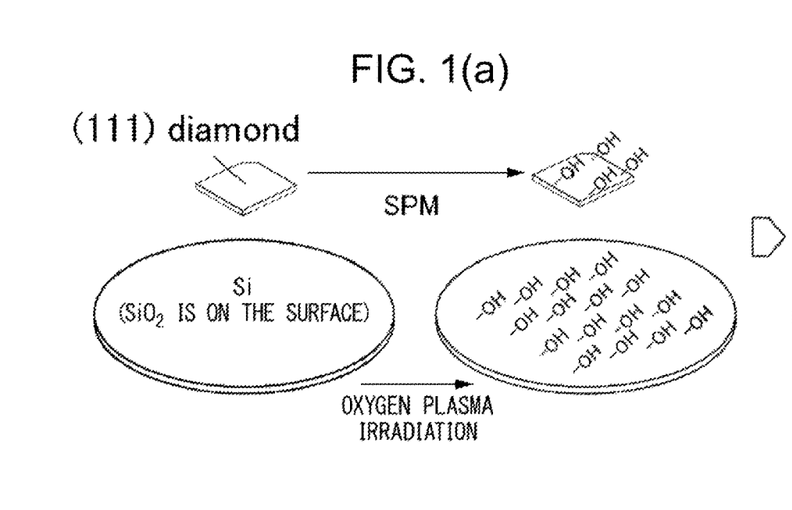
FIGS. 1(a) to 1(c) are perspective views for explaining a method for bonding a diamond crystal base and a base according to an embodiment.
Figure 1B:
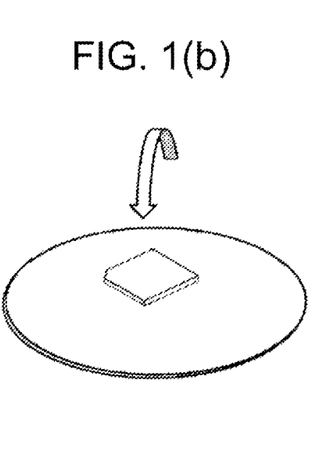
Figure 1C:
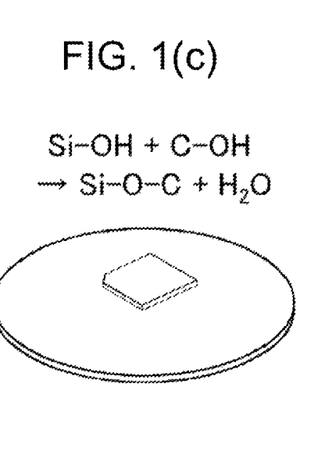

FIGS. 1(a) to 1(c) are schematic perspective views for explaining the method of bonding the diamond crystal base to the base according to the embodiment of the present application. The method for bonding the diamond crystal base to the base according to the embodiment includes a hydroxylation step and a bonding step. As illustrated in FIG. 1(a), in the hydroxylation step, the (111) surface of the diamond crystal base is treated with an oxidizing liquid, and OH groups are introduced to at least some C atoms of the (111) surface of the diamond crystal base.

The hydroxylation step is also the method for hydroxylating the surface of the diamond crystal base of the embodiment of the present application. Examples of the oxidizing liquid include a mixed solution of sulfuric acid and hydrogen peroxide (Sulfuric acid/Hydrogen Peroxide Mixture: SPM). When SPM is used, processing is preferably performed at a temperature of 75° C. or higher and 95° C. or lower. This is because, as shown in the Examples, the base and the diamond crystal base are strongly bonded.

As illustrated in FIG. 1(b), in the bonding step, the (111) surface of the diamond crystal base into which OH groups have been introduced in the hydroxylation step is brought into contact with the surface of the base provided with a hydroxide of a predetermined element M on the surface. In this embodiment, the base is a Si base, and the natural oxide film $SiO_2$ is formed on the surface of the base. As illustrated in FIG. 1 (a), a base having a hydroxide of a predetermined element on a surface thereof, that is, a base having Si—OH on a surface thereof, is obtained by irradiating the natural oxide film $SiO_2$ with oxygen plasma.

The predetermined element M is one or more selected from among metal elements capable of forming an oxide (excluding alkali metals and alkaline earth metals), Si, Ge, As, Se, Sb, Te, and Bi. Such metal elements include Al, elements from Sc with atomic number 21 to Ga with atomic number 31, elements from Y with atomic number 39 to Sn with atomic number 50, elements from La with atomic number 57 to La with atomic number 77, Ti and Pb. These elements M can form an oxide layer MOx at least on the surface. If an element M capable of forming the oxide layer MOx is used for the base, MOx can be converted to the hydroxide M-OH by appropriate treatment. Then, as described later, this M-OH and C—OH on the (111) surface of the diamond crystal base into which OH groups have been introduced undergo a dehydration reaction.

Then, as illustrated in FIG. 1(c), dehydration is performed by applying dehydration energy to this contact portion. Examples of dehydration energy include thermal energy, light energy, electrical energy, chemical energy, and the like. In the present embodiment, the contact portion is heated. As a result of this dehydration reaction, at least some C atoms of the (111) surface of the diamond crystal base is subjected to Si—O—C bonding. As a result, the diamond crystal base is bonded to the surface of the Si base. This bonding portion has sufficient shear strength.

The composite of the embodiment of the present application includes a base including an oxide layer MOx of a predetermined element M on a surface thereof, and a diamond crystal base bonded to the surface of the base. Then, the diamond crystal base is bonded to the surface of the base by M-O—C bonding at least some C atoms of the (111) surface of the diamond crystal base. The formation of the M-O—C bonding can be confirmed, for example, by FT-IR.

The base including the oxide layer MOx on the surface thereof may be a base including M or an M compound as a main component and a thermal oxide film or a natural oxide film MOx formed on the surface, or may be a base including MOx as a main component or including MOx. Examples of the base containing M or an M compound as a main component and having a thermal oxide film or a natural oxide film MOx formed on the surface thereof include an Si base, an SiC base, an SiN base, a Ge base, a GaAs base, a GaN base, an InP base, a Cu base, an Al base, an AlN base, a Ti base, and a TiN base, and the like. Examples of the base composed of MOx include a $SiO_2$ base, a $Ga_2O_3$ base, an $Al_2O_3$ base, a CuO base, a $TiO_2$ base, and the like. Furthermore, the base may have a single crystal structure or a polycrystal structure.

The predetermined element M is as described above. M is preferably at least one of Si, Ti, Al, Cu, In, and Ga. This is because a base having these oxide layer MOx on the surface thereof has MOC bonds with at least some C atoms of the (111) surface of the diamond crystal base, and is therefore easy to bond with the diamond crystal base. Furthermore, this is because the base containing Si, Ti, Al, Cu, In, and Ga are used in various fields, and the properties of diamond can be imparted to the base used in these various fields. Note that even when the (100) surface of the diamond crystal base is treated with an oxidizing liquid such as SPM, an OH group is unlikely to be introduced into C of the (100) surface. This is because by treating the (100) surface of the diamond crystal base with an oxidizing liquid, adjacent carbon atoms on the surface are likely to form a C—O—C bond.

Figure 2:
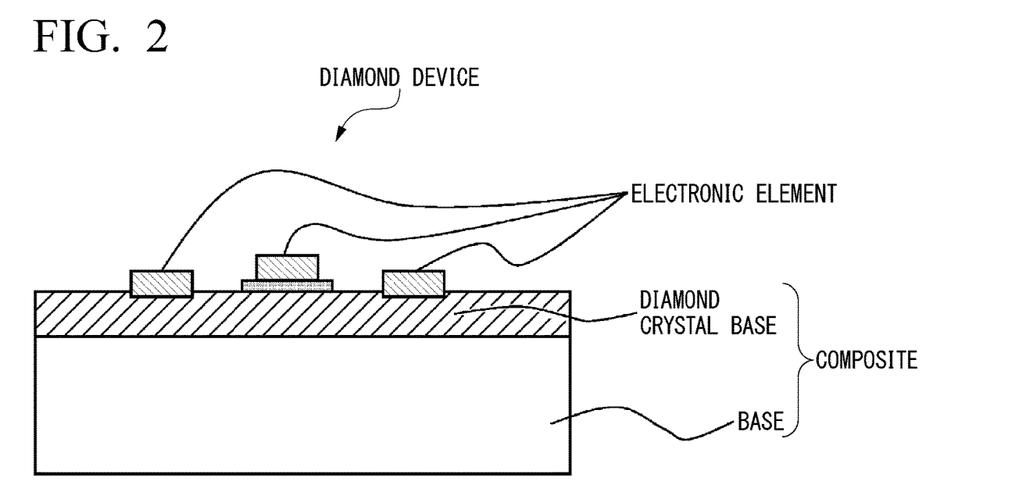
FIG. 2 is a cross-sectional schematic view of a diamond device that is an electronic device according to an embodiment.

The composite of the present embodiment can be applied to various fields. For example, if the base is an existing heat sink or heat spreader, the heat dissipation and heat absorption characteristics of the composite are enhanced due to the high thermal conductivity of diamond. Thus, the composite can be used as a new heat sink or heat spreader. In addition, the composite of the present embodiment can be applied to an electronic device. That is, as illustrated in FIG. 2, a certain electronic device includes the composite of the present embodiment, in which the diamond crystal base has a layered shape, one surface of the diamond crystal base is bonded to the surface of the base, and the electronic device further includes an electronic element formed on the other surface of the diamond crystal base.

This electronic device functions as a diamond device including an electronic element such as a semiconductor layered structure, a quantum device, a sensor, an ultraviolet light LED, or an electron emitting device on a diamond crystal base. As long as the diamond crystal structure hardly changes in the vicinity of the bonding surface as in the composite of this embodiment, the entire base is not an expensive diamond crystal, but only the surface layer of the inexpensive base is replaced with the diamond crystal base. Therefore, this diamond device can reduce costs.

Figure 3:
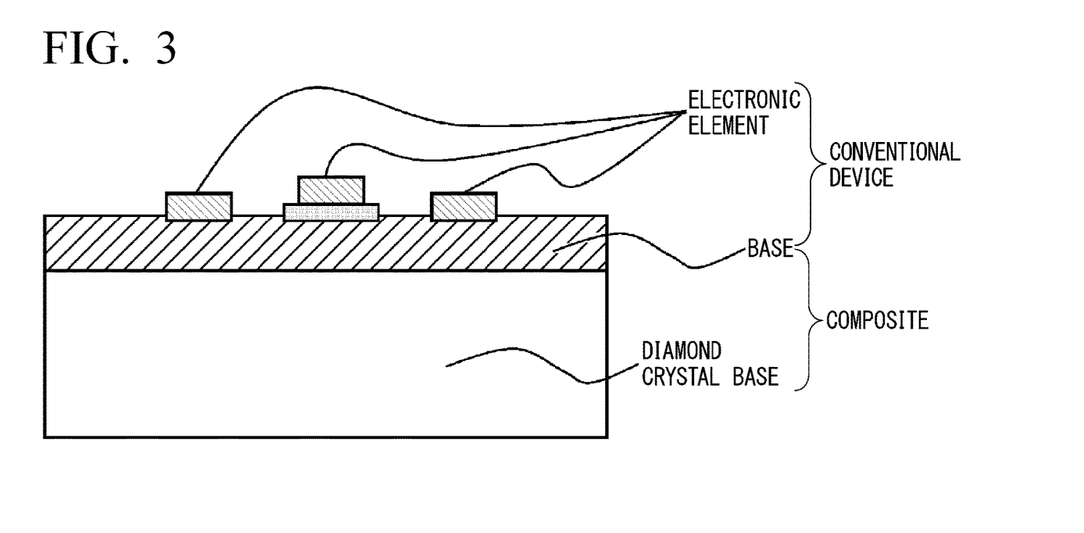
FIG. 3 is a cross-sectional schematic view of an electronic device according to another embodiment.

Further, as illustrated in FIG. 3, another electronic device includes the composite of the present embodiment, the base has a plate shape, one surface of the base is bonded to the surface of the diamond crystal base (111), and the electronic device further includes an electronic element formed on the other surface of the base. This electronic device has a structure in which a diamond crystal base is bonded under a base of a conventional device. Therefore, in this electronic device, the conventional device can efficiently dissipate heat from the diamond crystal base. In addition, since the dielectric breakdown electric field of the diamond crystal base is large, high power can be input to the electronic element of this electronic device.

EXAMPLES

1. Preparation of the Composite

Example 1

A diamond substrate (EDP, RH333KPPL, 3 mm×3 mm) with a (111) surface was immersed for 10 minutes in a mixed solution of 20 mL of 98% concentrated sulfuric acid and 5 mL of 35% hydrogen peroxide. A Si single crystal substrate (MATSUZAKI SEISAKUSHO CO., LTD., T4APX, a diameter of 100 mm) having a thermal oxide $SiO_2$ film with a thickness of 300 nm on the surface thereof was treated for 30 seconds with high-purity oxygen plasma with a pressure of 60 Pa and an output of 200 W. The surface of the $SiO_2$ film of the plasma-treated Si substrate, that is, the surface of the Si substrate provided with Si—OH, and the (111) surface of the diamond substrate were brought into contact with each other in the atmosphere and stored in a sealed container for three days together with a desiccant. Thereafter, these bases were heated at a temperature of 200° C. for 24 hours to obtain a composite.

Example 2

A composite was obtained in the same manner as in Example 1 with the exception that a Si single crystal substrate having a natural oxide $SiO_2$ film on the surface thereof with a thickness of about 1 nm was used instead of a Si single crystal substrate having a $SiO_2$ thermal oxide film on the surface thereof.

Example 3

A composite was obtained in the same manner as in Example 1 with the exception that a Si single crystal substrate having a Ti film on the surface thereof with a thickness of approximately 10 nm formed by a sputtering method was used in place of a Si single crystal substrate having a $SiO_2$ thermal oxide film on the surface thereof. Note that the $TiO_2$ film is thinly formed on the surface of the Ti film.

Example 4

A composite was obtained in the same manner as in Example 1 with the exception that a $Ga_2O_3$ polished single crystal substrate was used instead of a Si single crystal substrate provided with a $SiO_2$ thermal oxide film on the surface thereof.

Comparative Example

A composite was obtained in the same manner as in Example 1 with the exception that a diamond substrate having a (100) surface was used instead of the diamond substrate having a (111) surface.

2. Evaluation of the Composite

Figure 4:
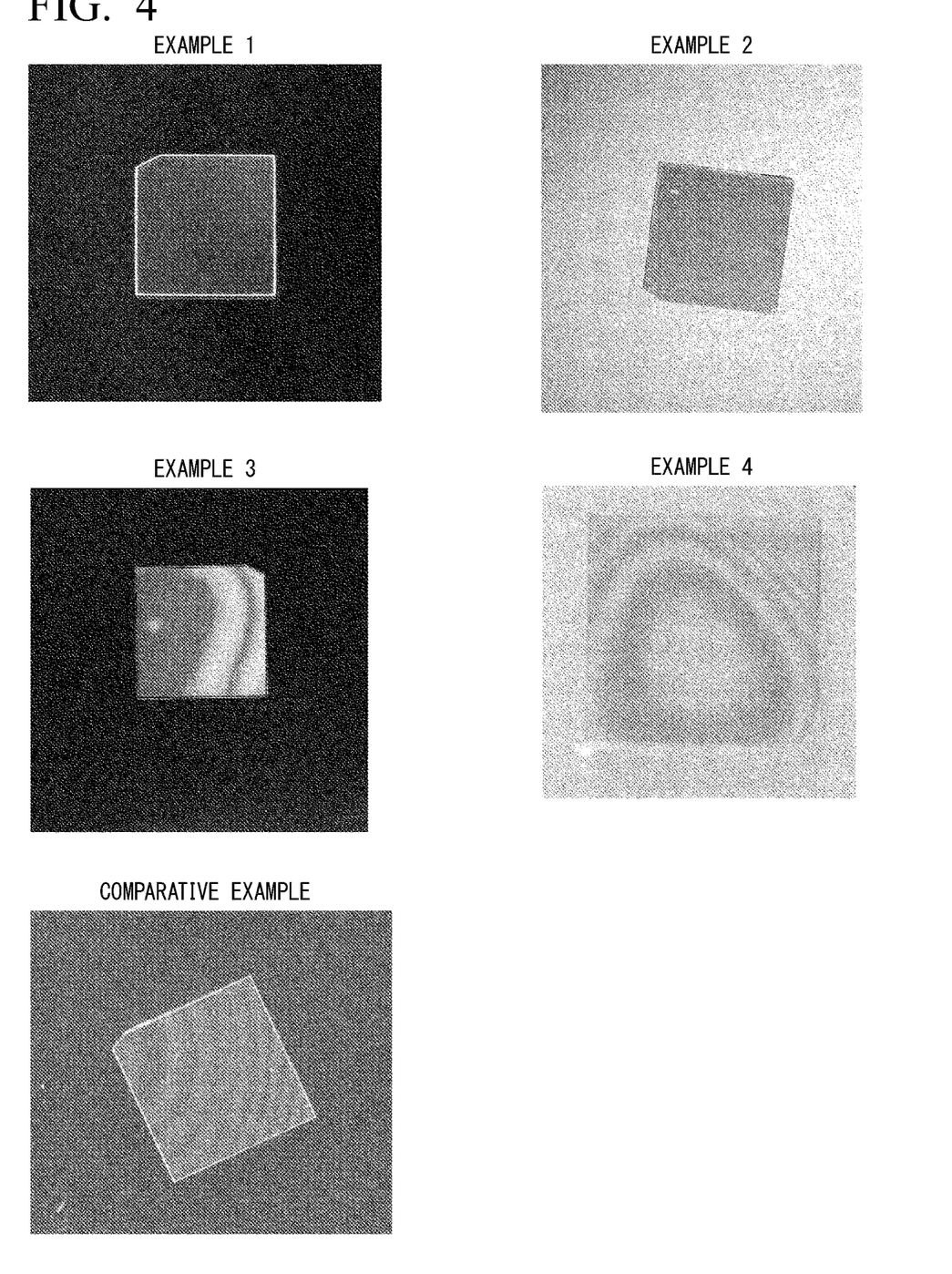
FIG. 4 are images of the diamond base side of the composites obtained in each of the examples and comparative examples.

FIG. 4 shows images of the diamond substrate side of the composites of Examples 1 to 4 and Comparative Example. In the composite of Example 1, the entire surface of the diamond substrate was bonded to the surface of the $SiO_2$ film of the Si substrate. The shear strength of the composite of Example 1 was 9.0 kgf. In the composite of Example 2, the entire surface of the diamond substrate was bonded to the Si substrate. The shear strength of the composite of Example 2 was 18 kgf.

In the composite of Example 3, approximately half of the surface of the diamond substrate was bonded to the surface of the Ti film of the Si substrate. The shear strength of the composite of Example 3 was 7.4 kgf. In the composite of Example 4, approximately half of the surface of the diamond substrate was bonded to the $Ga_2O_3$ substrate. The shear strength of the composite of Example 4 was 5.0 kgf. In the composite of the Comparative Example, the diamond substrate was hardly bonded to the Si substrate. The shear strength of the composite of the comparative example was less than 0.2 kgf. As shown in FIG. 4, the portion where Newton's rings are observed is the portion where it is not bonded.

Figure 5:
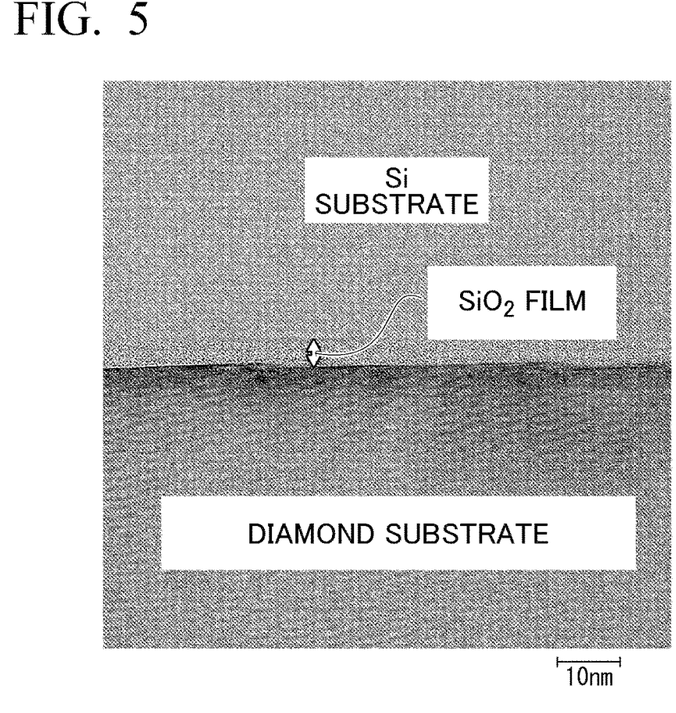
FIG. 5 is a cross-sectional TEM image of the composite of Example 2.
Figure 6:
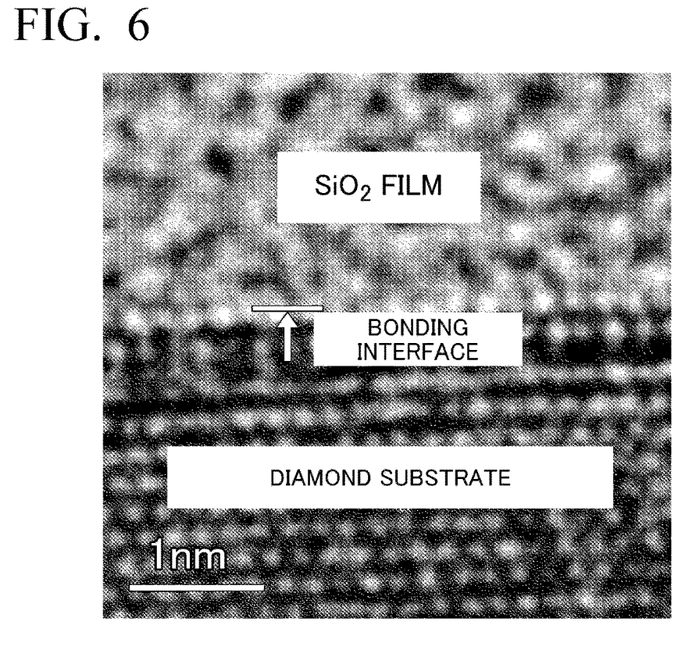
FIG. 6 is a cross-sectional TEM image of the composite of Example 2 at a magnification different from that of FIG. 5.

FIG. 5 shows a cross-sectional TEM image of the composite of Example 2. As illustrated in FIG. 5, the composite of Example 2 included a diamond substrate, a Si substrate, and an approximately 4 nm thick $SiO_2$ film therebetween. FIG. 6 shows a cross-sectional TEM image of Example 2 at a magnification different from that of FIG. 5. As illustrated in FIG. 6, the diamond substrate and the $SiO_2$ film were bonded at atomic level. Further, the stepped portion of the surface of the diamond substrate was filled with $SiO_2$.

Figure 7A:
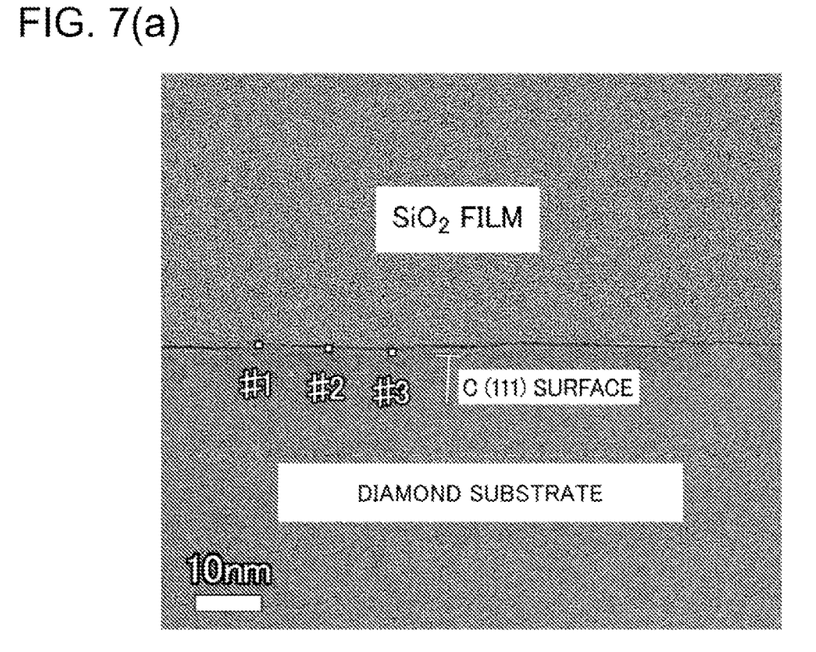
FIG. 7(a) is a cross-sectional TEM image of the composite of Example 1.
Figure 7B:
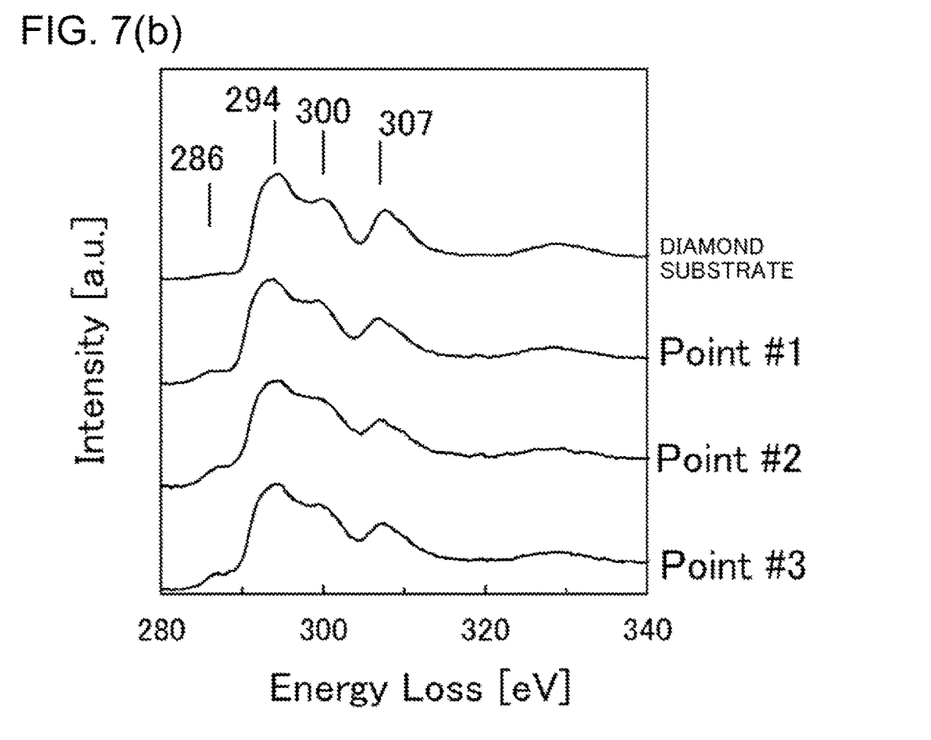
FIG. 7(b) is an EELS spectra for each point shown in FIG. 7(a) and a diamond base.

FIG. 7(a) shows a cross-sectional TEM image of the composite of Example 1. FIG. 7(b) illustrates EELS spectrum in each of the Point #1 to #3 near the surface of the diamond substrate illustrated in FIG. 7(a) and in the diamond substrate. The peaks at 300 eV and 307 eV in the EELS spectrum are intrinsic peaks for diamond. As illustrated in FIG. 7(b), a specific peak of diamond was also observed near the bonding interface between the diamond substrate and the $SiO_2$ film. That is, the crystallinity of the diamond was not lost even in the vicinity of the bonding interface between the diamond substrate and the $SiO_2$ film.

Figure 8:
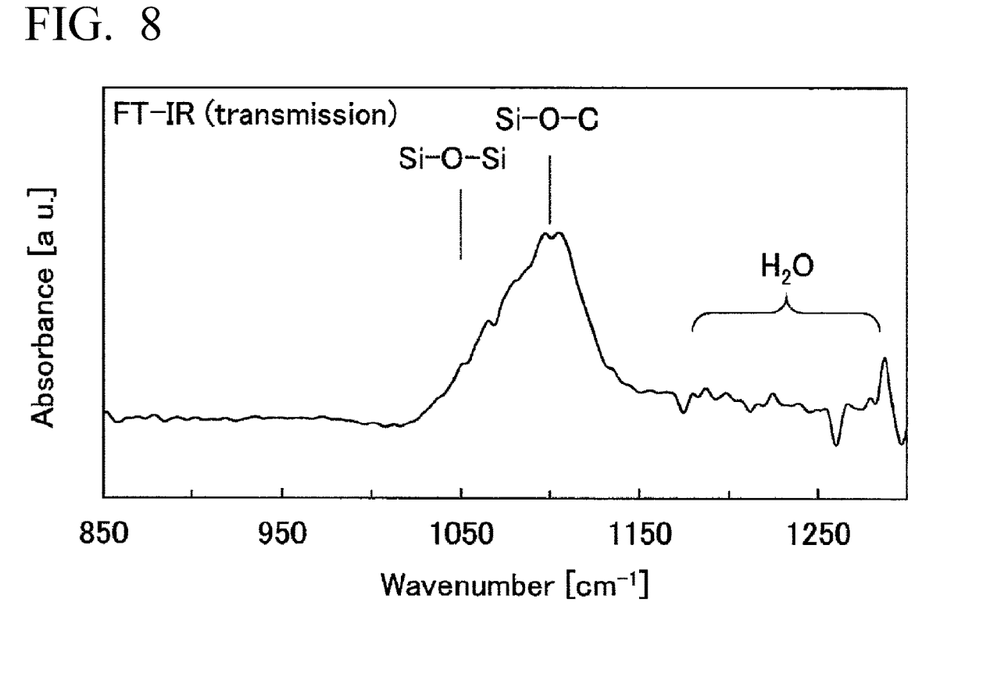
FIG. 8 is a FT-IR spectrum of the composite of Example 1.

FIG. 8 is a FT-IR spectrum of the composite of Example 1. This spectra is obtained by taking the common logarithm of the value obtained by dividing the absorption spectra of the laminated portion of the Si substrate with the thermal oxide $SiO_2$ film on the surface thereof and the diamond substrate by the absorption spectrum of Si substrate with thermal oxide $SiO_2$ film on the surface thereof. As shown in FIG. 8, a peak attributed to Si—O—C bond was observed near 1100 $cm^{-1}$. In other words, it was found that the diamond crystal base was bound to the $SiO_2$ film due to the Si—O—C bonding of at least some C atoms of the (111) surface of the diamond crystal base. This indicates that the dehydration reaction described below proceeded.

Si—OH+C—OH→Si—O—C+$H_2O$

Figure 9:
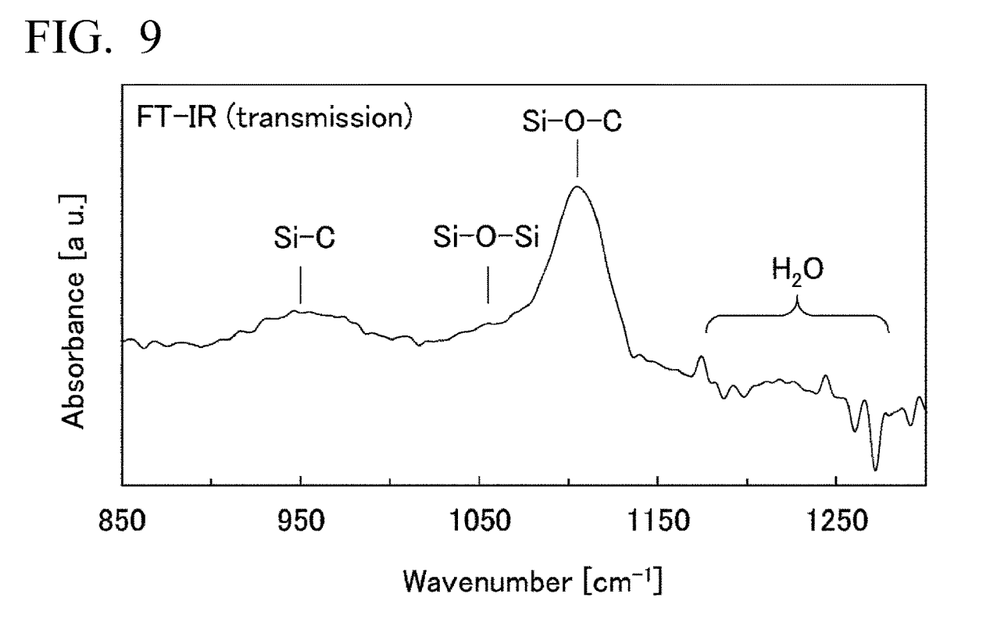
FIG. 9 is a FT-IR spectrum of the composite of Example 2.

FIG. 9 is a FT-IR spectra of the composite of Example 2 measured in a manner similar to that of FIG. 8. As shown in FIG. 9, a peak attributed to Si—O—C bonds was also observed near 1100 cm$^{-1}$ in the composite of Example 2. Also, a peak attributed to Si—C bonds was observed separately from Si—O—C bonds. Because the surface of the Si base of the composite of Example 2 is a naturally oxidized $SiO_2$ film that is considerably thinner than the thermal oxide $SiO_2$ film, it is possible that Si and C were partially directly bonded.

Figure 10:
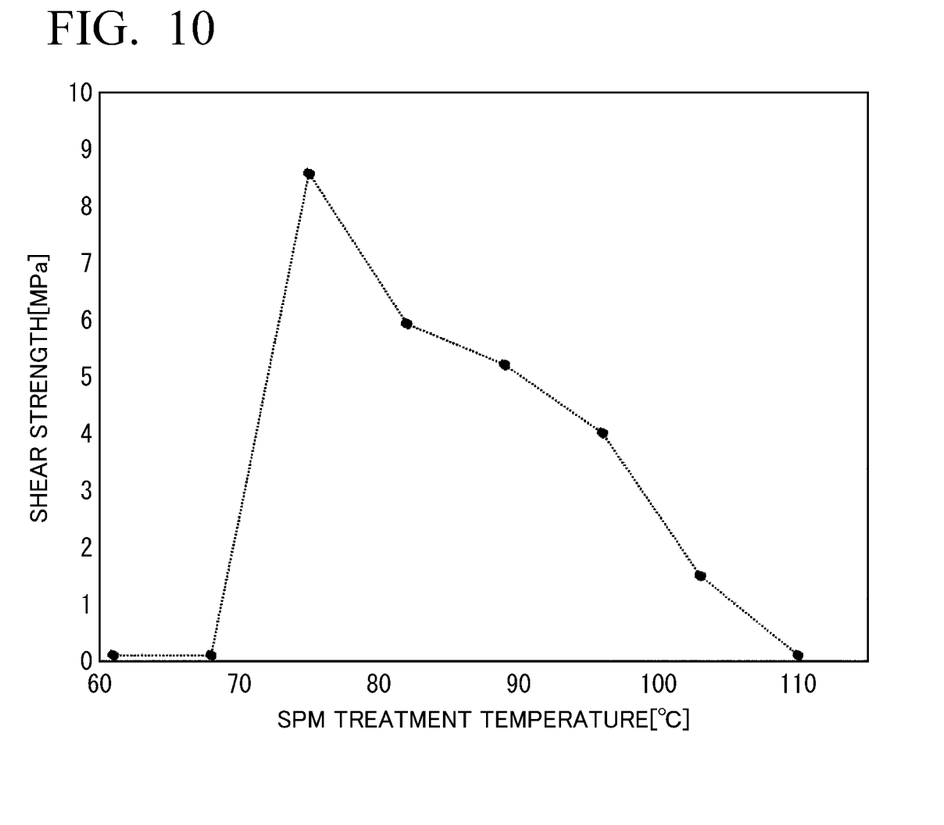
FIG. 10 is a graph showing the relationship between SPM processing temperature and shear strength of the composite in the process of manufacturing the composite of Example 1.

FIG. 10 shows the relationship between SPM treatment temperature and shear strength of the in the process of manufacturing the composite of Example 1. As illustrated in FIG. 10, the SPM treatment temperature is preferably from 75° C. or higher and 95° C. or lower, and particularly preferably around 75° C. It is believed that if the SPM processing temperature is too low, OH groups introduced to C atoms of the (111) surface of the diamond crystal base will be insufficient, and the formation of Si—O—C bonds that form the bond will also be insufficient. Also, when the SPM treatment temperature is too high, it is considered that the reaction on the (111) surface of the diamond crystal substrate becomes excessive, the (111) surface becomes rough, and the (111) surface and the $SiO_2$ film cannot be adhered to each other.

To confirm this, the root-mean-square roughness (RMS) of the (111) surfaces of the diamond crystal substrate was measured. The RMS of the (111) surface of the diamond crystal before SPM treatment was 0.3 nm, and the RMS of the (111) surface of the diamond crystal after SPM treatment at a temperature of 75° C. was 0.4 nm. In contrast, the RMS of the (111) surface of the diamond crystal substrate after SPM treatment at a temperature of 110° C. was 0.8 nm.

From these RMSs, it was confirmed that too high SPM processing temperature resulted in greater irregularities in the (111) surface of the diamond crystal base. Note that when SPM treatment was performed on the (100) surface of the diamond crystal substrate at a temperature of 110° C., RMS was 0.3 nm, which was the same as before SPM treatment. The (100) surface of the diamond crystal substrate is believed to be less reactive with SPM. That is, OH groups are unlikely to be introduced into C atoms of the (100) surface of the diamond crystal substrate.

The invention claimed is:

1. A composite, comprising:
   a base comprising an oxide layer MOx of an element M on a surface thereof and a diamond crystal base bonded to the surface of the base,
   wherein the M is one or more selected from among metal elements capable of forming an oxide (excluding alkali metals and alkaline earth metals), Si, Ge, As, Se, Sb, Te, and Bi, and the diamond crystal base is bonded to the surface of the base by M-O—C bonding of at least some C atoms of the (111) surface of the diamond crystal base.

2. The composite according to claim 1, wherein the M is one or more selected from among Si, Ti, Al, Cu, In, and Ga.

3. The composite according to claim 1, wherein the base is a heat sink or a heat spreader.

4. An electronic device, comprising the composite according to claim 1; wherein the diamond crystal base has a layered shape, one surface of the diamond crystal base is bonded to the surface of the base, and an electronic element formed on the other surface of the diamond crystal base.

5. An electronic device, comprising the composite according to claim 1;
   wherein the base has a plate shape, one surface of the base is bonded to the (111) surface of the diamond crystal base, and the electronic device further comprises an electronic element formed on the other surface of the base.

6. A method for hydroxylating a surface of a diamond crystal base, comprising: treating a (111) surface of the diamond crystal base with an oxidizing liquid to introduce OH groups to at least some C atoms of the (111) surface of the diamond crystal base.

7. The method or hydroxylating a surface of a diamond crystal base according to claim 6;
   wherein the oxidizing liquid is a mixed solution of sulfuric acid and hydrogen peroxide.

8. The method for hydroxylating a surface of a diamond crystal base according to claim 7;
   wherein treatment is performed with the mixed solution having a temperature of 75° C. or higher and 95° C. or less.

9. A method of bonding a base and a diamond crystal base, comprising:
   a hydroxylation step of treating a (111) surface of the diamond crystal base with an oxidizing liquid to introduce OH groups to at least some C atoms of the (111) surface of the diamond crystal base; and
   a bonding step of bringing the (111) surface to which OH groups are introduced at the hydroxylation step into contact with the surface of the base having hydroxides of one or more selected from among metal elements capable of forming an oxide (excluding alkali metals and alkaline earth metals), Si, Ge, As, Se, Sb, Te, and Bi, and bonding the surfaces by applying dehydration energy to the contact portion to cause a dehydration reaction in the contact portion.

* * * * *